United States Patent [19]
Lee et al.

[11] Patent Number: 5,332,917
[45] Date of Patent: Jul. 26, 1994

[54] SEMICONDUCTOR MEMORY NAND WITH WIDE SPACE BETWEEN SELECTION LINES

[75] Inventors: Hyong-gon Lee; Jung-dal Choi, both of Suwon; Sok-guen Chang, Seoul, all of Rep. of Korea

[73] Assignee: Samsung Electronics Co., Ltd., Kyungki

[21] Appl. No.: 170,884

[22] Filed: Dec. 21, 1993

[30] Foreign Application Priority Data

Dec. 28, 1992 [KR] Rep. of Korea .................. 92-25763

[51] Int. Cl.$^5$ ........................................... H01L 29/68
[52] U.S. Cl. ......................................... 257/390; 365/51; 365/104
[58] Field of Search ................... 365/104, 51, 185; 257/390, 315

[56] References Cited

U.S. PATENT DOCUMENTS

| | | | |
|---|---|---|---|
| 4,481,609 | 11/1984 | Higuchi et al. | 365/51 |
| 4,924,438 | 5/1990 | Kobatake | 365/185 |
| 5,235,200 | 8/1993 | Komori et al. | 257/315 |

FOREIGN PATENT DOCUMENTS 3-59892  3/1991  Japan .................. 365/104

Primary Examiner—Robert Limanek
Attorney, Agent, or Firm—Stephen R. Whitt; Robert A. Westerlund; Charles R. Donohoe

[57] ABSTRACT

A semiconductor memory device having a NAND-type memory cell structure for preventing the occurrence of an electrical bridge resulting from impurity particles generated during a manufacturing process. The space between the word-line whereto a Vcc voltage is applied and the string selection line whereto a Vss voltage is applied and a space between the string selection line of the string selection transistor and the word-line of the cell transistor adjacent to the string selection transistor, are wider than that between the word-lines so as to prevent early stand-by current failure caused by the special stand-by conditions of a NAND-type memory cell. Therefore, the occurrence of a polysilicon bridge between the word-line and the string selection line due to impurity particles generated during the manufacturing process is prevented. As a result, a defectively manufactured chip can be resurrected by the data correction means provided within the memory device.

7 Claims, 8 Drawing Sheets

FIG. 3 (PRIOR ART)

| MODE<br>NODE | (STAND-BY) | READ MODE | |
|---|---|---|---|
| | | Ⓐ | Ⓑ |
| | | READ VOLTAGE "L" | READ VOLTAGE "H" |
| BIT-LINE | FLOATING | READ VOLTAGE "L" | READ VOLTAGE "H" |
| STRING SELECTION LINE 1 | 0V | Vcc | 0V |
| STRING SELECTION LINE 2 | 0V | 0V | Vcc |
| WORD-LINE 1 | Vcc | Vcc | Vcc |
| WORD-LINE 2 | Vcc | 0V | Vcc |
| WORD-LINE n-1 | Vcc | Vcc | 0V |
| WORD-LINE n | Vcc | Vcc | Vcc |

| NODE \ MODE | (STAND-BY) | READ OPERATION | |
|---|---|---|---|
| | | READ VOLTAGE "L" (A) | READ VOLTAGE "H" (B) |
| BIT-LINE | FLOATING | Vcc | Vcc |
| STRING SELECTION LINE 1 | 0V | Vcc | Vcc |
| STRING SELECTION LINE 2 | 0V | 0V | 0V |
| WORD-LINE 1 | Vcc | Vcc | Vcc |
| WORD-LINE 2 | Vcc | 0V | 0V |
| WORD-LINE n | Vcc | Vcc | Vcc |
| GROUND SELECTION LINE | 0V | Vcc | Vcc |

FIG. 6 (PRIOR ART)

SEMICONDUCTOR MEMORY NAND WITH WIDE SPACE BETWEEN SELECTION LINES

BACKGROUND OF THE INVENTION

The present invention relates to a semiconductor memory device, and more particularly, to a semiconductor device having a NAND-type memory structure.

A NAND-type memory cell structure is in use for almost all memory cells of the 4M bit level and higher, due to its advantage of easy high integration.

FIGS. 1 and 2 show the layout and equivalent circuit of the conventional NAND-type mask read-only-memory (ROM) cell structure.

Referring to FIG. 1, reference numeral 1 indicates an N+ active region used as the drain and source of a transistor, reference numeral 2 is an ion doped region having a depletion-type channel, reference numeral 3 is a region used as the gate electrode of the transistor and as connecting means inside the chip, reference numeral 4 is a contact hole region for interconnecting between the active region and a metal wiring, and between the metal wiring and a polysilicon layer, and reference numeral 5 is a metal wiring (bit-line) used as the connecting means.

As shown in FIGS. 1 and 2, in the conventional NAND-type mask ROM cell, two strings in parallel one of which is constituted by two string selection transistors and multi-cells numbering 4, 8, 16, 32 and so on which are serially connected between the bit-line contact and the ground line by equal spaces, are connected to one bit-line contact, to thereby constitute a basic unit in constructing the memory cell array. Here, one string comprises two transistors having an enhancement-type channel and depletion-type channel, respectively.

The conventional NAND-type mask ROM cell operates as follows, with reference to FIGS. 1, 2 and 3. Operation when cell A is turned on while cell B is turned off in FIGS. 1 and 2 will be explained.

First, in stand-by operation, the string selection line is at zero volts (0 V), the word-line is at Vcc level, and the bit line is floated. In read mode operation, when the string selection line 1 is Vcc level and the string selection line 2 is at 0 V, the string 1 is selected. In string 1, word-line 2 is switched to 0 V and the remaining word-lines thereof are switched to Vcc level, in order to select the cell transistor A of FIG. 2. At this time, the voltage of a bit line is determined as the selected cell, that is, a logic "low" or "high" depending on the state of cell A, is determined. In other words, logic "high" is selected when cell A is an enhancement-type NMOS, and logic "low" is selected when cell A is a depletion-type NMOS. A sense amplifier detects the bit-line voltage, thereby determining the data input/output (I/O).

FIGS. 4, 5 and 6 respectively show the layout, equivalent circuit thereof and the operation state of the memory cell structure where the ground selection line is added to the conventional NAND-type mask ROM cell so as to open the current path between word-line Vcc and ground in stand-by mode when a gate oxide film of cell transistor fails, i.e., when the oxide film is damaged.

Referring to the operations of the memory cell, the ground selection line is switched to "0 V" in stand-by mode, while the remaining operations are the same as those of the conventional NAND-type memory cell.

The occurrence of a polysilicon bridge resulting from impurity particles increases geometrically as the layout of the conventional NAND-type memory cell increases to ultra-high integration. Accordingly, the error correction code (ECC) or redundancy is provided so as to improve yield and reliability. However, a chip becomes defective due to poor stand-by current which has to be tested in the early stages of manufacturing when the string selection line and word-line or the word-line and ground selection line are electrically connected by the polysilicon bridge. Accordingly, the data correction effect by the ECC circuit or by a redundancy circuit cannot be obtained.

SUMMARY OF THE INVENTION

It is an objective of the present invention to provide a semiconductor device which can prevent the occurrence of an electrical bridge resulting from impurity particles generated during a manufacturing process, by laying out the space between the word-line and string selection line (respectively supplied with Vcc and 0 V) and that between the word-line and ground selection line, wider than the space between word-lines in stand-by or read operations of the chip of the semiconductor device having an ultra high integration NAND-type memory cell.

To accomplish the above object of the present invention, there is provided a semiconductor memory device having a NAND-type memory cell structure where string selection transistors and cell transistors are serially connected so as to form a single string, characterized in that a space between string selection lines of the string selection transistor is wider than that of between word-lines of the cell transistors. Further, a space between a first string selection line of the string selection transistors and a word-line of a cell transistor adjacent to the first string selection line is wider than that of between word-lines of the cell transistors.

According to one preferred embodiment of the present invention, the space between the string selection lines of the string selection transistors and the space between the first string selection line of the string selection transistors and the word-line of the cell transistor adjacent to the first string selection line are both at least as wide as and not more than twice that between the word-lines of the cell transistor. Assuming that the space between the string selection lines of the string selection transistors and the space between the first string selection line of the string selection transistors and the word-line of the cell transistor adjacent to the first string selection line are Y, and the space between the word-lines of the cell transistor is X, the relationship between X and Y is preferably expressed as $1.1X \leq Y \leq 2X$.

The present invention provides a semiconductor memory device having a NAND-type memory cell structure where string selection transistors, cell transistors and a ground selection transistor are serially connected so as to form a single string, characterized in that spaces between the string selection lines of the string selection transistors, between a first string selection line of the string selection transistors and a first word-line of the cell transistors adjacent to the string selection line, and between a ground selection line of the ground selection transistor and a second word-line of the cell transistors adjacent to the selection ground transistor are wider than that between the word-lines of the cell transistors. The spaces between the string selection lines of the string selection transistors, between a first string selection line of the string selection transistors and a first word-line of the cell transistors adjacent to the string selection line, and between a ground selection line of the ground selection transistor and a second word-line of the cell transistors adjacent to the selection ground transistor are all as wide as and not more than twice that between the word-lines of the cell transistors. Assuming that the spaces between the string selection lines of the string selection transistors, between a first string selection line of the string selection transistors and a first word-line of the cell transistors adjacent to the string selection line, and between a ground selection line of the ground selection transistor and a second word-line of the cell transistors adjacent to the selection ground transistor are Y, and the space between the word-lines of the cell transistors is X, the relationship between X and Y is preferably expressed as $1.1X \leq Y \leq 2X$.

The electrical short caused by an impurity particle during the manufacturing process is prevented in the mask ROM which has 16 Mb integration or greater and proceeds to the submicron by the layout of a NAND-type mask ROM cell according to the present invention, to thereby prevent the current and function failures in the read operation.

BRIEF DESCRIPTION OF THE DRAWINGS

The above objects and other advantages of the present invention will become more apparent by describing in detail a preferred embodiment thereof with reference to the attached drawings in which:

FIG. 3 is a chart for explaining the operation of the conventional NAND-type memory cell;

FIG. 6 is a chart to explain the operation of the conventional NAND-type memory cell;

DETAILED DESCRIPTION OF THE INVENTION

The present invention will be described below in more detail with reference to the attached drawings.

The construction of a semiconductor memory device of the present invention will be explained with reference to FIG. 7.

Figure 1:
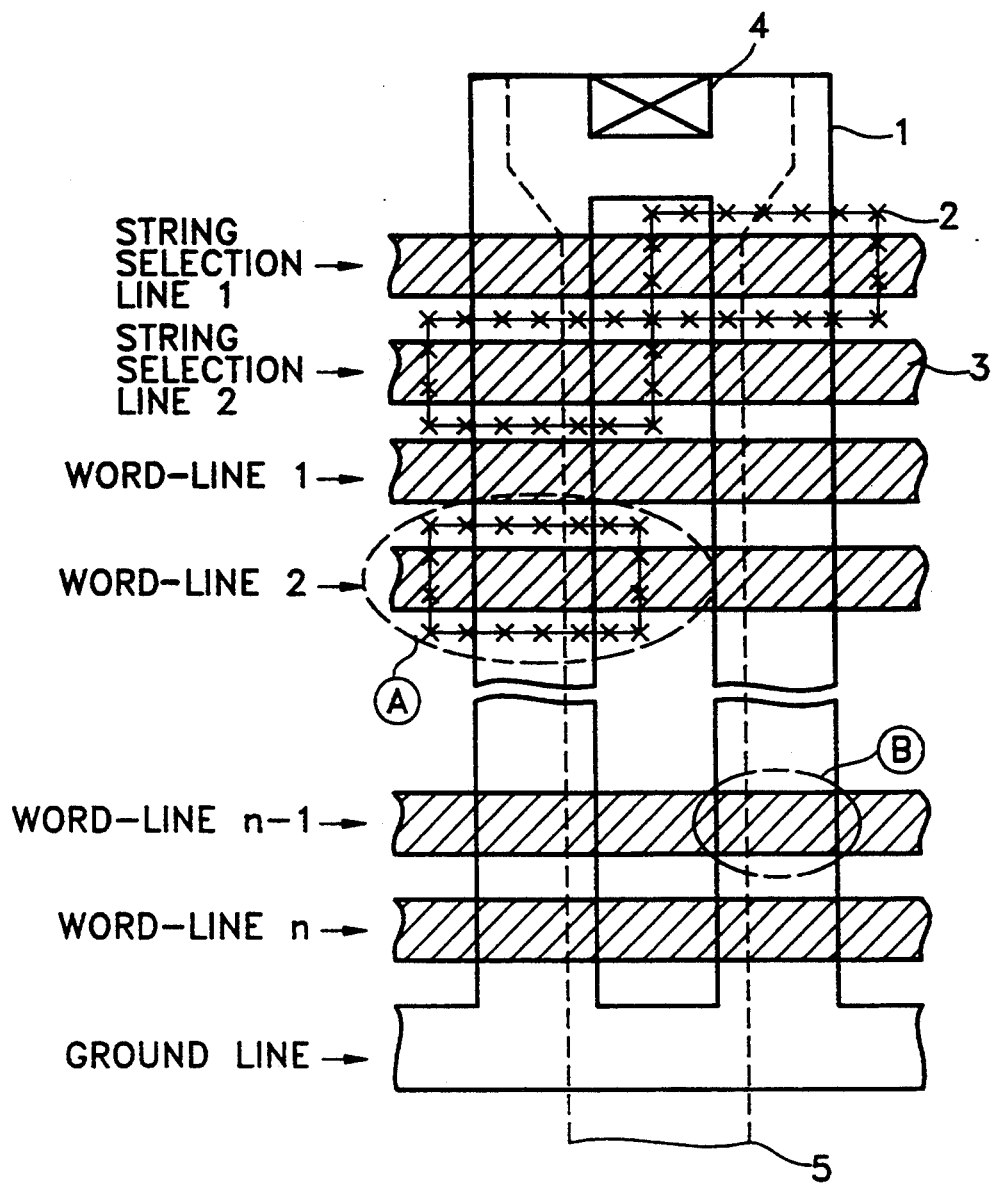
FIG. 1 shows the layout of the conventional NAND-type memory cell.
Figure 2:
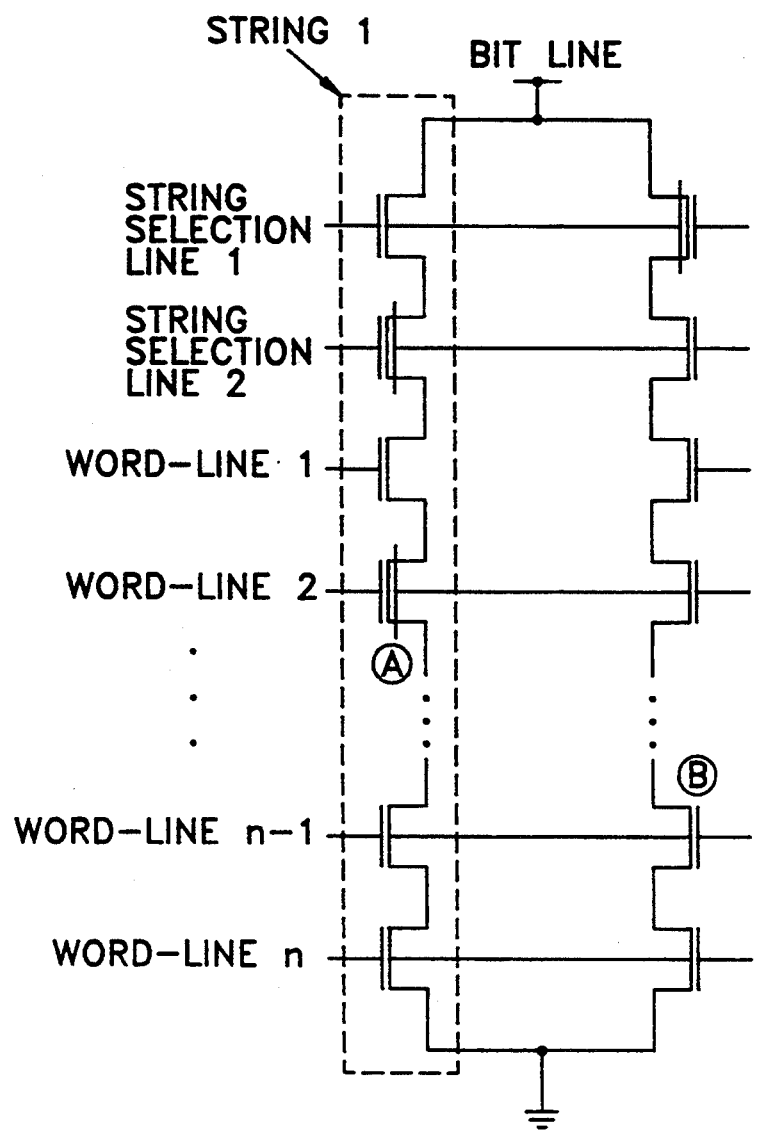
FIG. 2 is an equivalent circuit diagram of FIG. 1.
Figure 4:
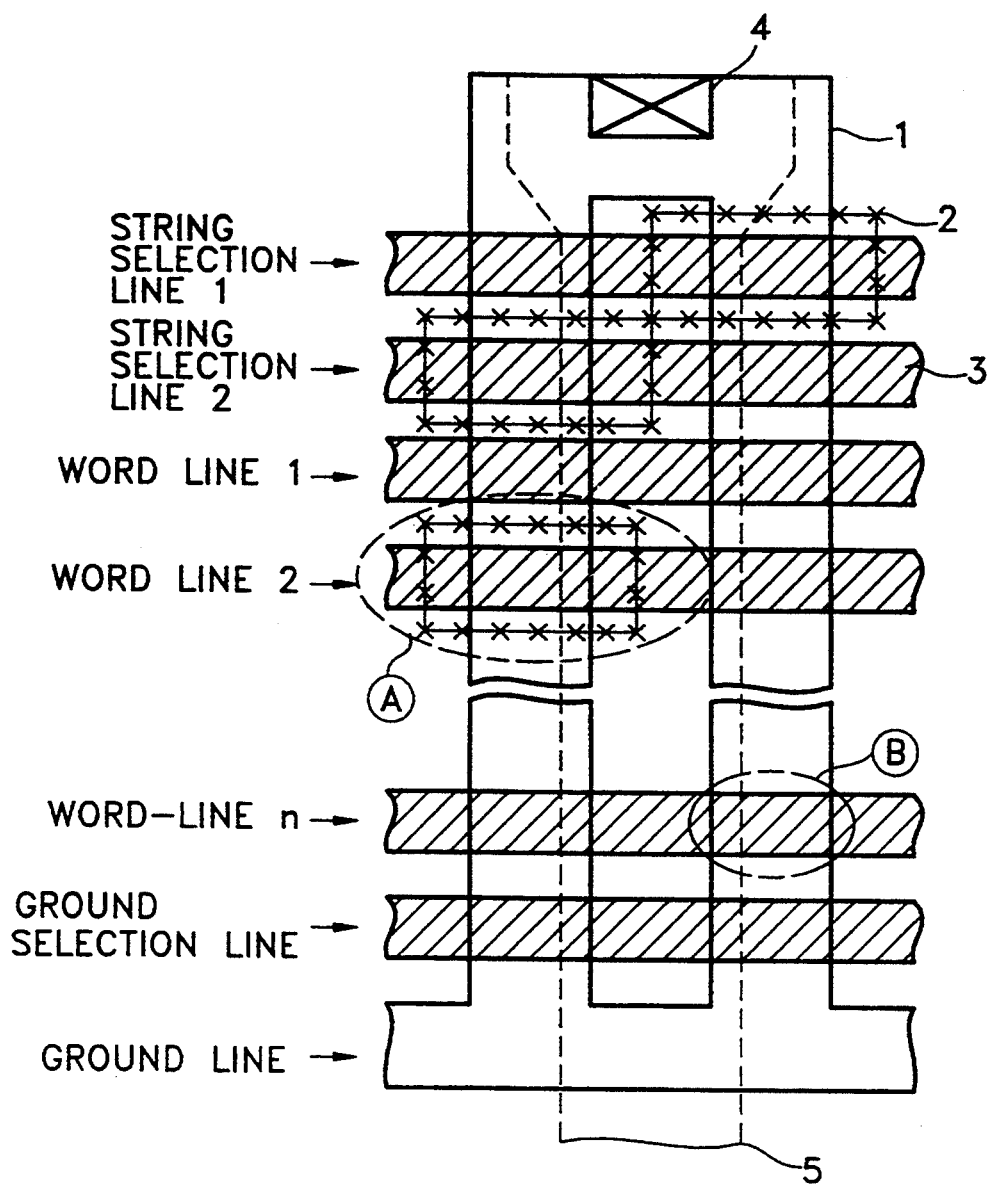
FIG. 4 shows another layout of the conventional NAND-type memory cell.
Figure 5:
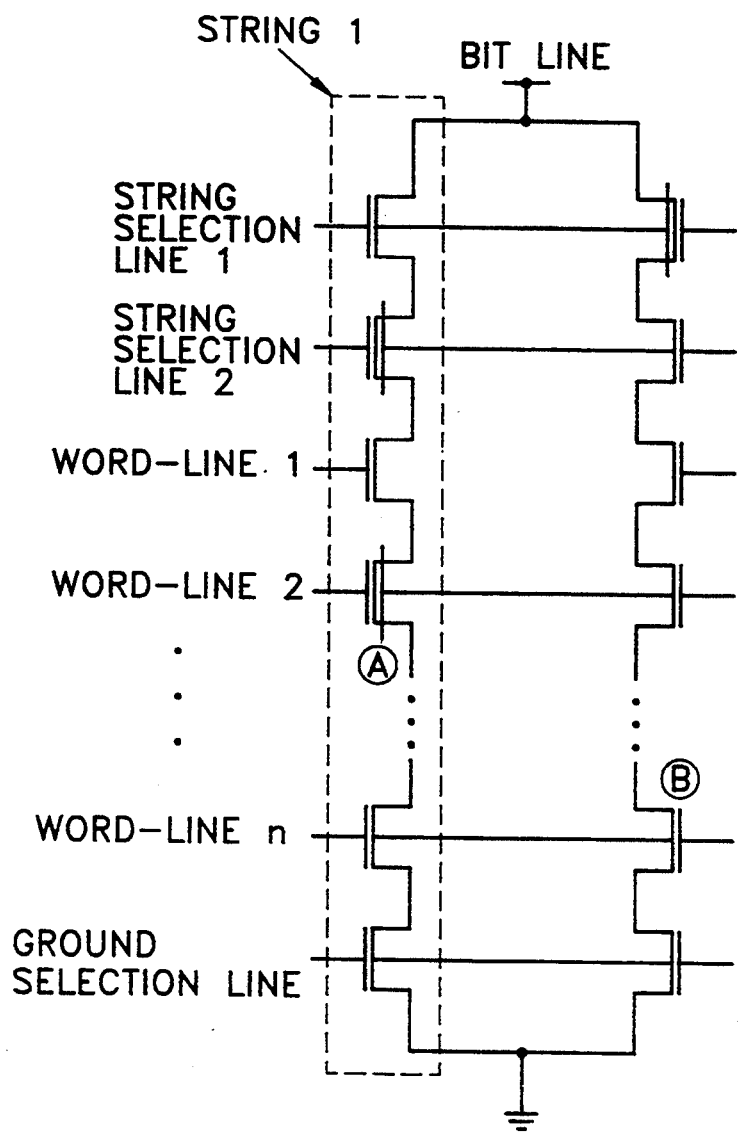
FIG. 5 is an equivalent circuit diagram of FIG. 4.
Figure 7:
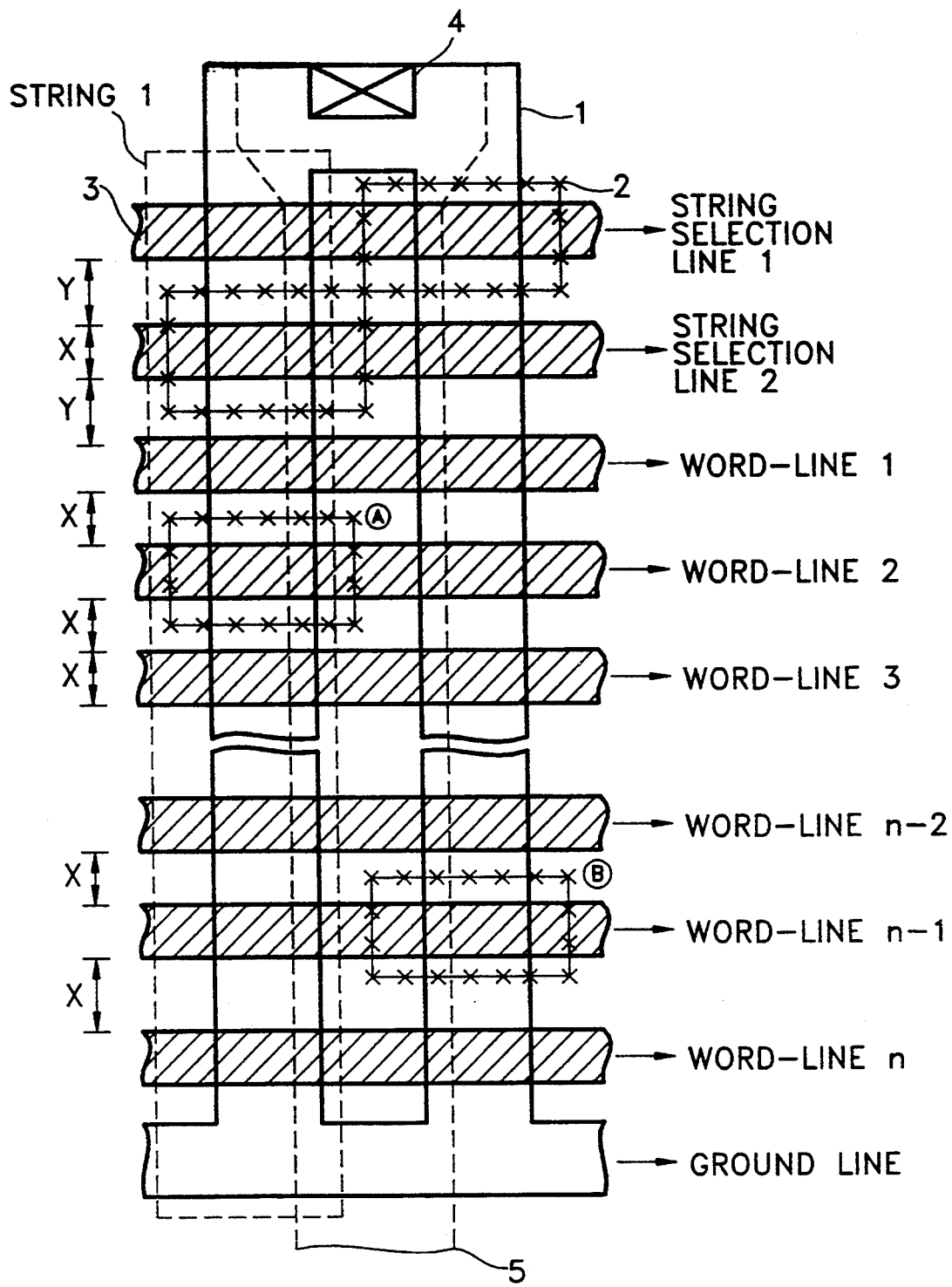
FIG. 7 shows a layout of a NAND-type memory cell according to one embodiment of the present invention.

FIG. 7 shows a layout of a NAND-type mask ROM cell according to one embodiment of the present invention. Referring to FIG. 7, reference numeral 1 indicates an N+ active region for forming the drain and source of a transistor, reference numeral 2 indicates P+ ion-doped regions wherein P+ impurities for forming a depletion-type channel, such as phosphorus (P) or arsenic (As) have been implanted, reference numeral 3 indicates a polysilicon line used as a gate electrode of the transistor or as connecting means inside the chip, reference numeral 4 indicates a contact hole region for connecting between an active region and a metal wiring or between the polysilicon layer and the metal wiring layer, and reference numeral 5 indicates a metal wiring (bit-line) used as the connecting means.

FIG. 7 shows two strings one of which is made by serially connecting two string selection transistors and 8, 16, 32 . . . , 2n cell transistors between the bit-line and active region 1 for the ground line.

Operation of the NAND-type memory cell of FIG. 7 can be explained as follows.

All memories perform stand-by, read and write operations. Stand-by and read modes are explained here, as an example.

First, in a stand-by mode, string selection lines 1 and 2 and word-lines 1 to n are respectively set to ground and Vcc levels.

In reading mode, string 1 is selected when string selecting line 1 is switched to Vcc and string selecting line 2 is grounded. Also, word-line 2 is switched to Vss, while the remaining word-lines are switched to Vcc, so as to select cell A, which means that the voltage of the bit-line is determined depending whether cell A is a depletion-type or enhancement-type.

In the NAND-type memory cell of the present invention, the spaces between the string selection line and the word-line and between the string selection lines 1 and 2 are laid out as Y (here, $1.1 X \leq Y \leq 2 X$), assuming that the space between the word-lines are X, while the polysilicon which constitutes a string selection line and a word-line and the space are laid out with equal spacing in the conventional NAND-type memory cell.

The above layout gives advantages as follows.

In an ultralarge scale integration semiconductor memory device, the design rule of a polysilicon line within a memory array must be submicron. Thus, ECC or a redundancy are provided in order to improve the yield and reliability. However, in the layout having a conventional NAND-type memory cell structure, a polysilicon line is electrically connected due to the impurity particles generated during the manufacturing process. At this time, when the string selection line and the word-line are electrically connected (bridged) by the impurity particles, the string selection line at Vss and the word-line at Vcc are shorted in the stand-by mode, to thereby generate a stand-by failure. Accordingly, yield and reliability enhancements by the data correction means of an ECC operation or redundancy cannot be obtained. Therefore, the problem can be solved by enlarging the space between the string selection line and the word-line in the semiconductor element where the submicron design rule is applied.

For example, when the pitch of polysilicon lines is 1.0 μm (that is, the line is 0.5 μm and the space is 0.5 μm), the space between the word-lines is 0.5 μm (or "X"). However, space Y between the word-line and the string selection line is laid out larger than 0.5 μm and smaller than 1.0 μm.

Figure 8:
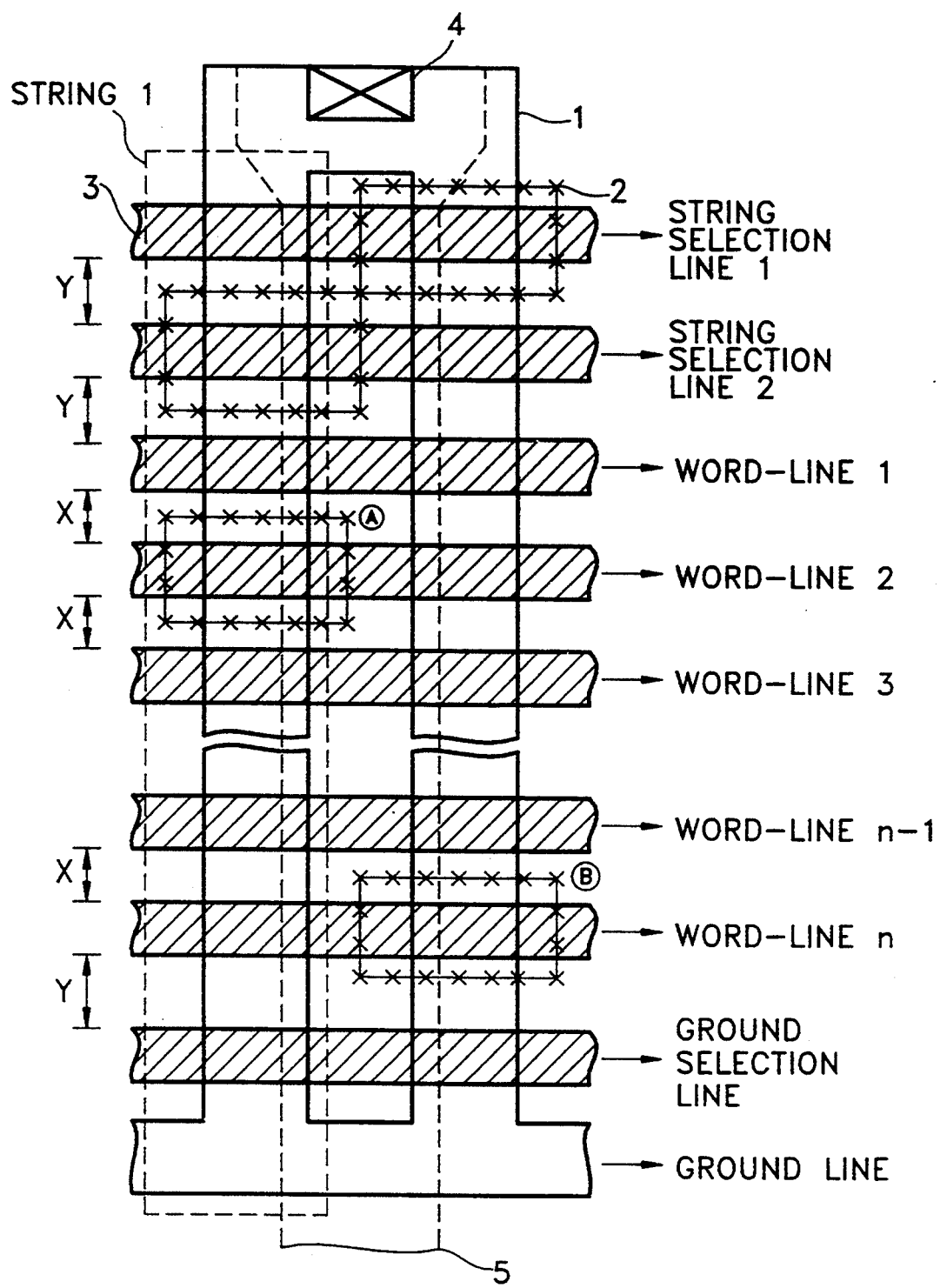
FIG. 8 shows another layout of a NAND-type memory cell according to another embodiment of the present invention.

FIG. 8 shows another embodiment of the present invention, adding the ground selection line to the NAND-type memory cell structure of FIG. 7.

The objective of adding the ground selection line is as follows. The word-line where the Vcc is applied and the ground line are shorted in stand-by mode when the problem occurs (for example, the gate oxide film is damaged) in a gate oxide film of the cell transistor due to the impurity particles generated during the manufacturing process, to thereby create a current path. At this time, the data correction effect (ECC or redundancy) fails if the current path is not open. Accordingly, the ground selection line which can be grounded in the stand-by mode is added so as to block the current path.

In the memory cell structure, stand-by current becomes unacceptable when the polysilicon bridge is generated between the word-line and the ground selection line due to the impurity particles. Therefore, the space between the ground selection line and the word-line is laid out as Y (here, $1.1\,X \leq Y \leq 2\,X$) which is larger than X, i.e., the space between the word-lines.

The electrical short caused by an impurity particle during the manufacturing process is prevented in the mask ROM which has 16 Mb integration or greater and proceeds to the submicron by the layout of a NAND-type mask ROM cell according to the present invention, to thereby prevent the current and function failures in the read operation. As a result, productivity is enhanced. The effect of the present invention increases as the channel length of the transistor within the cell array is reduced in accordance with higher capacity semiconductor memory devices. The effect further increases when the ECC design and the redundancy, which can repair the word-line so as to resurrect the failed bit, are used.

Yield and reliability of an ultra-high integration semiconductor memory device can be remarkably enhanced according to the present invention, and a chip without failures can be achieved by the data correction means in the memory device having such data correction means.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor memory device having a NAND-type memory cell structure where string selection transistors and cell transistors are serially connected so as to form a single string, characterized in that a space between string selection lines of said string selection transistor is wider than that of between word-lines of said cell transistors.

2. A semiconductor memory device as claimed in claim 1, wherein a space between a first string selection line of said string selection transistors and a word-line of a cell transistor adjacent to said first string selection line is wider than that of between word-lines of said cell transistors.

3. A semiconductor memory device according to claim 2, wherein the space between the string selection lines of said string selection transistors and the space between said first string selection line of said string selection transistors and said word-line of said cell transistor adjacent to said first string selection line are both at least as wide as and not more than twice that between the word-lines of said cell transistor.

4. A semiconductor memory device as claimed in claim 3, wherein assuming that the space between said string selection lines of said string selection transistors and the space between said first string selection line of said string selection transistors and said word-line of said cell transistor adjacent to said first string selection line are Y, and the space between the word-lines of said cell transistor is X, the relationship between X and Y is expressed as $1.1\,X \leq Y \leq 2\,X$.

5. A semiconductor memory device having a NAND-type memory cell structure where string selection transistors, cell transistors and a ground selection transistor are serially connected so as to form a single string.

characterized in that spaces between the string selection lines of said string selection transistors, between a first string selection line of said string selection transistors and a first word-line of said cell transistors adjacent to said string selection line, and between a ground selection line of said ground selection transistor and a second word-line of said cell transistors adjacent to said selection ground transistor are wider than that between the word-lines of said cell transistors.

6. A semiconductor memory device according to claim 5, wherein the spaces between the string selection lines of said string selection transistors, between a first string selection line of said string selection transistors and a first word-line of said cell transistors adjacent to said string selection line, and between a ground selection line of said ground selection transistor and a second word-line of said cell transistors adjacent to said selection ground transistor are all as wide as and not more than twice that between the word-lines of said cell transistors.

7. A semiconductor memory device as claimed in claim 6, wherein assuming that the spaces between the string selection lines of said string selection transistors, between a first string selection line of said string selection transistors and a first word-line of said cell transistors adjacent to said string selection line, and between a ground selection line of said ground selection transistor and a second word-line of said cell transistors adjacent to said selection ground transistor are Y, and the space between the word-lines of said cell transistors is X, the relationship between X and Y is expressed as $1.1\,X \leq Y \leq 2\,X$.

* * * * *